US012778254B2

(12) United States Patent
Weng

(10) Patent No.: US 12,778,254 B2
(45) Date of Patent: Nov. 3, 2026

(54) MOBILE PHONE PROTECTIVE CASE WITH STATIC ELECTRICITY ELIMINATION DEVICE

(71) Applicant: Shenzhen Guangyipeng Technology Co., Ltd., Shenzhen (CN)

(72) Inventor: Jie Weng, Shenzhen (CN)

(73) Assignee: Shenzhen Guangyipeng Technology Co., Ltd., Shenzhen (CN)

( * ) Notice: Subject to any disclaimer, the term of this patent is extended or adjusted under 35 U.S.C. 154(b) by 341 days.

(21) Appl. No.: 18/430,669

(22) Filed: Feb. 2, 2024

(65) Prior Publication Data

US 2025/0204663 A1 Jun. 26, 2025

(30) Foreign Application Priority Data

Dec. 20, 2023 (CN) ......................... 202323494478.8

(51) Int. Cl.

*A45C 13/00* (2006.01)
*H05K 9/00* (2006.01)
*A45C 11/00* (2006.01)

(52) U.S. Cl.

CPC ......... *A45C 13/002* (2013.01); *H05K 9/0067* (2013.01); *A45C 11/002* (2025.01)

(58) Field of Classification Search

CPC ................. A45C 11/002; A45C 13/002; G06F 2200/1633; G06F 1/1626; G06F 1/1656; G06F 1/1637; H05K 9/0067; H05K 1/0259; H05K 5/06; H01Q 1/50; H02J 50/005; H02J 7/63; H04B 1/3888; H04M 1/04; H04M 1/185; H04M 1/18; H04M 1/0203; H01H 2223/044

See application file for complete search history.

(56) References Cited

U.S. PATENT DOCUMENTS

2013/0220841 A1* 8/2013 Yang ....................... B63C 11/02 206/37
2015/0312884 A1* 10/2015 Kharitonov ........... H04M 19/04 455/412.2
2015/0313003 A1* 10/2015 Kasar ..................... H05K 3/284 174/541
2019/0208879 A1* 7/2019 Gawley .................. A45C 13/02
2021/0034113 A1* 2/2021 Schwarz ............... G06F 1/1656

FOREIGN PATENT DOCUMENTS

CN 105983175 A * 10/2016
KR 20220057780 A * 5/2022 ........... H05K 9/0067

* cited by examiner

*Primary Examiner* — Quoc Thai N Vu

(57) ABSTRACT

A mobile phone protective case with static electricity elimination device includes a case and a static electricity elimination device. The case includes a bottom wall and a side wall. The side wall protrudes from a periphery of the bottom wall towards one side of the bottom wall. The side wall and the bottom wall enclose an accommodation cavity for accommodating a mobile phone. The static electricity elimination device is installed in the case and includes first and second conductive elements arranged spaced apart from each other, and a resistor and an LED lamp electrically connected between the first and second conductive elements, wherein the first and second conductive elements are at least partially exposed from the case. A receiving groove is defined in an inner side the case, and the resistor and the LED lamp are received in the receiving groove.

20 Claims, 12 Drawing Sheets

MOBILE PHONE PROTECTIVE CASE WITH STATIC ELECTRICITY ELIMINATION DEVICE

CROSS-REFERENCE TO RELATED APPLICATIONS

The present application claims priority of Chinese Utility Model Application No. 202323494478.8, filed on Dec. 20, 2023, the entire contents of which are hereby incorporated by reference.

TECHNICAL FIELD

The present disclosure belongs to the technical field of mobile phone accessories, and more specifically, relates to a mobile phone protective case with static electricity elimination device.

DESCRIPTION OF THE PRIOR ART

In daily life, especially in the dry seasons of autumn and winter, a large amount of static electricity is prone to be generated on the human body due to the friction of clothing, and the instantaneous voltage may be up to several thousand volts or even tens of thousands volts. When the human body comes into contact with a conductive element, a discharge phenomenon occurs, making people experience the discomfort of electric shock, and even causing severe pain when the voltage is very high. Therefore, how to eliminate human body static electricity is a major topic that needs to be addressed.

SUMMARY OF THE DISCLOSURE

The objective of the present disclosure is to provide a mobile phone protective case with static electricity elimination device, so as to solve or mitigate the technical problem existing in the prior art.

A mobile phone protective case with static electricity elimination device, comprising: a case comprising a bottom wall and a side wall, the side wall protruding from a periphery of the bottom wall towards one side of the bottom wall, and the side wall and the bottom wall cooperatively enclosing an accommodation cavity for accommodating a mobile phone; a static electricity elimination device installed in the case, and the static electricity elimination device comprising: a first conductive element and a second conductive element arranged spaced apart from each other, as well as a resistor and an LED lamp electrically connected between the first and second conductive elements, wherein the first and second conductive elements are at least partially exposed outside the case, a receiving groove is defined in an inner side of the case, and the resistor and the LED lamp are received in the receiving groove.

In some embodiments, the LED lamp and the resistor are connected in series between the first and second conductive elements.

In some embodiments, the static electricity elimination device further comprises a flexible circuit board, the resistor and the LED lamp are arranged on the flexible circuit board, and the flexible circuit board comprises a first conductive contact portion for electrically connecting to the first conductive element as well as a second conductive contact portion for electrically connecting to the second conductive element.

In some embodiments, the flexible circuit board is substantially Z-shaped and compromises an elongated body portion, as well as first and second connecting portions respectively connected to two longitudinal ends of the body portion, the first and second connecting portions respectively extend towards two sides of the body portion, and the first and second conductive contact portions are respectively arranged on the first and second connecting portions.

In some embodiments, an accommodation groove is defined in the inner side of the case, and the flexible circuit board is received in the accommodation groove.

In some embodiments, conductive lines of the flexible circuit board, the resistor and the LED lamp are arranged on a surface of the flexible circuit board facing a bottom of the accommodation groove.

In some embodiments, the case is provided with first and second perforations penetrating inner and outer sides thereof at positions corresponding to the first and second connecting portions, respectively, and the first and second connecting portions extend through the first and second perforations, respectively, from the inner side of the case to the outer side of the case.

In some embodiments, the first and second conductive elements are both metal pieces, and the first and second conductive elements are snap-connected to the outer side of the case and are electrically connected to the first and second conductive contact portions, respectively.

In some embodiments, the case comprises a back shell forming the bottom wall and a frame forming the side wall, the back shell is integrally wrapped around by overmoulding, the accommodation groove is formed on an inner side of the back shell, the accommodation groove extends across the receiving groove, and projection of the frame on a plane of the back shell is spaced apart from the LED lamp.

In some embodiments, the back shell is made of transparent materials or semi-transparent materials, and when the LED lamp illuminates, light emitted from the LED lamp passes through the back shell 11 and is thus visible from outside.

In some embodiments, the case is substantially rectangular, and the first conductive element is disposed on an outer side of one long side of the case at a middle portion.

In some embodiments, the second conductive element is disposed outside a corner of the case.

, wherein the second conductive element is disposed outside the corner that is adjacent to the long side of the case.

In some embodiments, the first perforation is defined in the side wall of the case, and the second perforation is defined in the bottom wall of the case.

In some embodiments, the back shell is made of plastic with higher hardness, and the frame is made of plastic or rubber with lower hardness and greater elasticity.

In some embodiments, the back shell comprises a plate-shaped main body and a first protruding portion extending from the main body, the first protruding portion is located at a long edge of the main body, a recess is formed on an outer side of a wall of the frame corresponding to the first protruding portion of the back shell, the wall of the frame and the first protruding portion together define a first groove at the recess, and the first conductive element is engaged in the first groove.

In some embodiments, a first through hole is formed in a central portion of the first protruding portion, a second through hole is formed at a bottom of the first groove for the flexible circuit board to extend through, and the second through hole is aligned with the first through hole of the back shell and together form the first perforation for the first connecting portion of the flexible circuit board to extend through.

In some embodiments, an inner surface of the main body defines the receiving groove for accommodating the resistor and the LED lamp, the accommodation groove for accommodating the flexible circuit board, and the second perforation for the second connecting portion of the flexible circuit board to extend through.

In some embodiments, the back shell further comprises a second protruding portion extending from a corner of the main body, the frame is formed with a limit rib as one single piece, the limit rib is spaced apart from a corner wall to form a window, the limit rib is located outside the second protruding portion of the back shell, and the second protruding portion of the back shell is exposed from the window; wherein a part of the wall of the frame located on both sides of the second protruding portion in circumferential direction extends beyond an edge of the second protruding portion, the part of the wall and the limit rib cooperatively enclose a second groove, and the second conductive element is engaged in the second groove.

In some embodiments, a width of the frame in a direction perpendicular to the main body of the back shell is greater than thickness of the main body, so that a part of the frame beyond the main body forms the side wall of the case.

In the mobile phone protective case with static electricity elimination device according to embodiments of the present disclosure, the first conductive element exposed outside the case is configured to contact the user's body, and the second conductive element is configured to contact the person or object to be contacted by the user, such as a door handle or faucet, etc. When the user is electrostatically charged and there exists a potential difference between the user and the person or object to be contacted, a circuit loop between the first conductive element and the second conductive element will be formed, the current will be consumed through the resistor, and the LED lamp will illuminate at the same time to indicate a process of electrostatic consumption. When the LED lamp is no longer illuminating, it means that the static electricity has been completely consumed. Therefore, the user can determine through the LED lamp whether the static electricity has been eliminated, thus the mobile phone protective case with static electricity elimination device according to the present disclosure can visually display the static electricity elimination process, which is easy to use.

BRIEF DESCRIPTION OF DRAWINGS

To illustrate the technical solution of the embodiments of the present disclosure more clearly, the drawings used in embodiments or the prior art are briefly described below. Apparently, the drawings in the following description are some embodiments of the present disclosure, and according to these drawings, an ordinary skilled person in the art can obtain other drawings without paying any creative effort.

DESCRIPTION OF EMBODIMENTS

Figure 1:
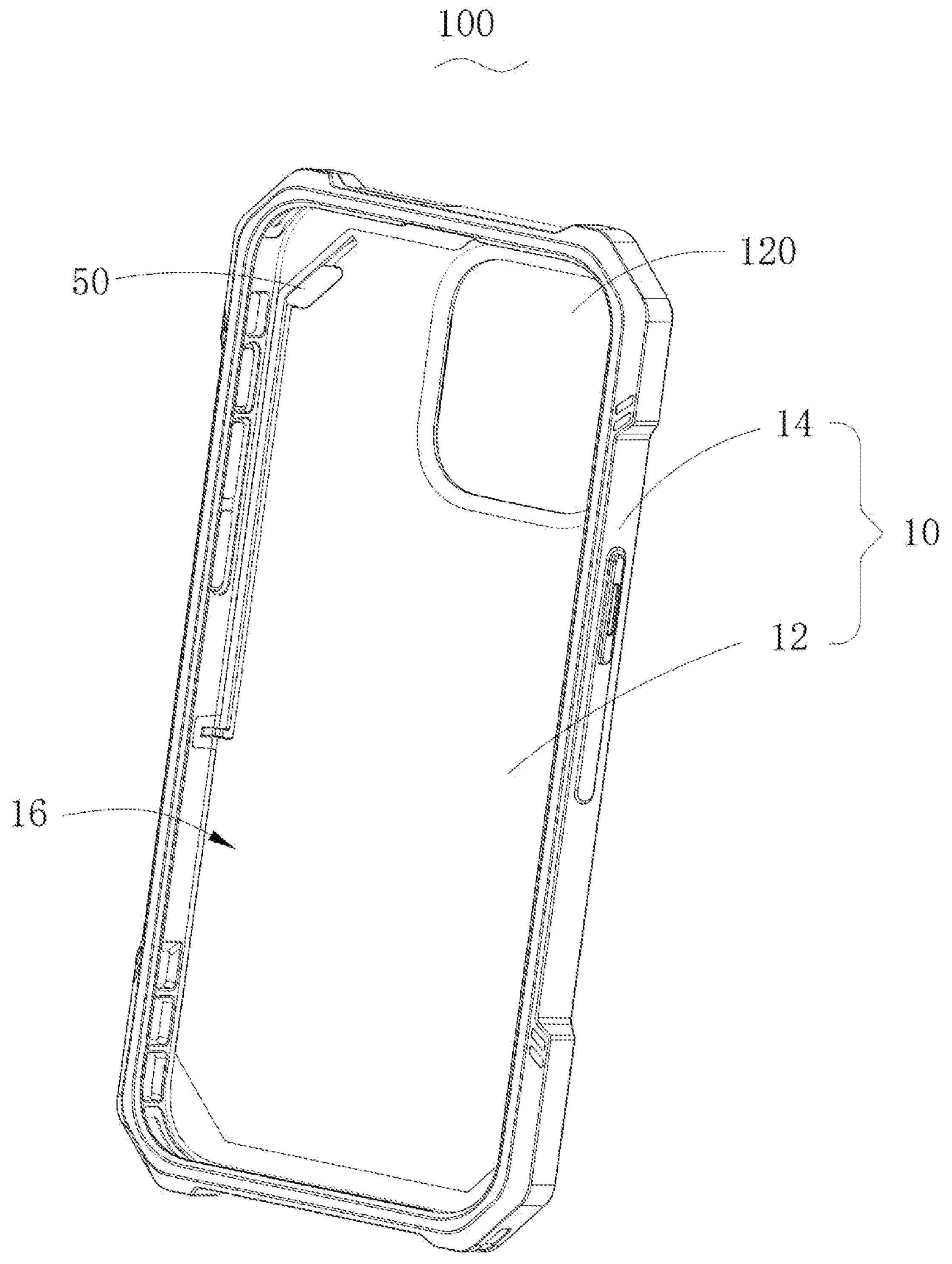
FIG. 1 is a perspective view of a mobile phone protective case with static electricity elimination device according to an embodiment of the present disclosure.
Figure 2:
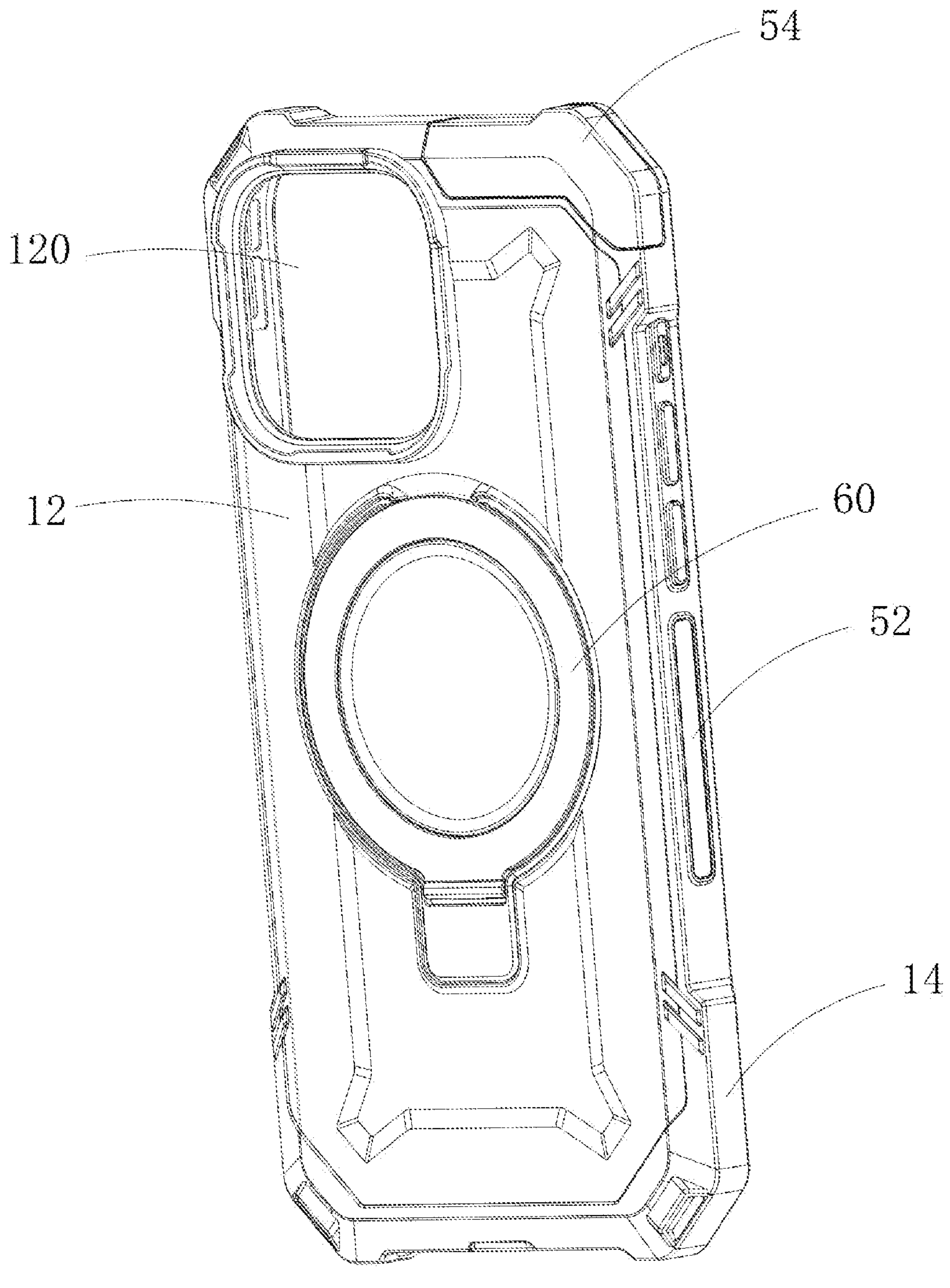
FIG. 2 is a perspective view of the mobile phone protective case with static electricity elimination device shown in FIG. 1, viewed from another angle.
Figure 3:
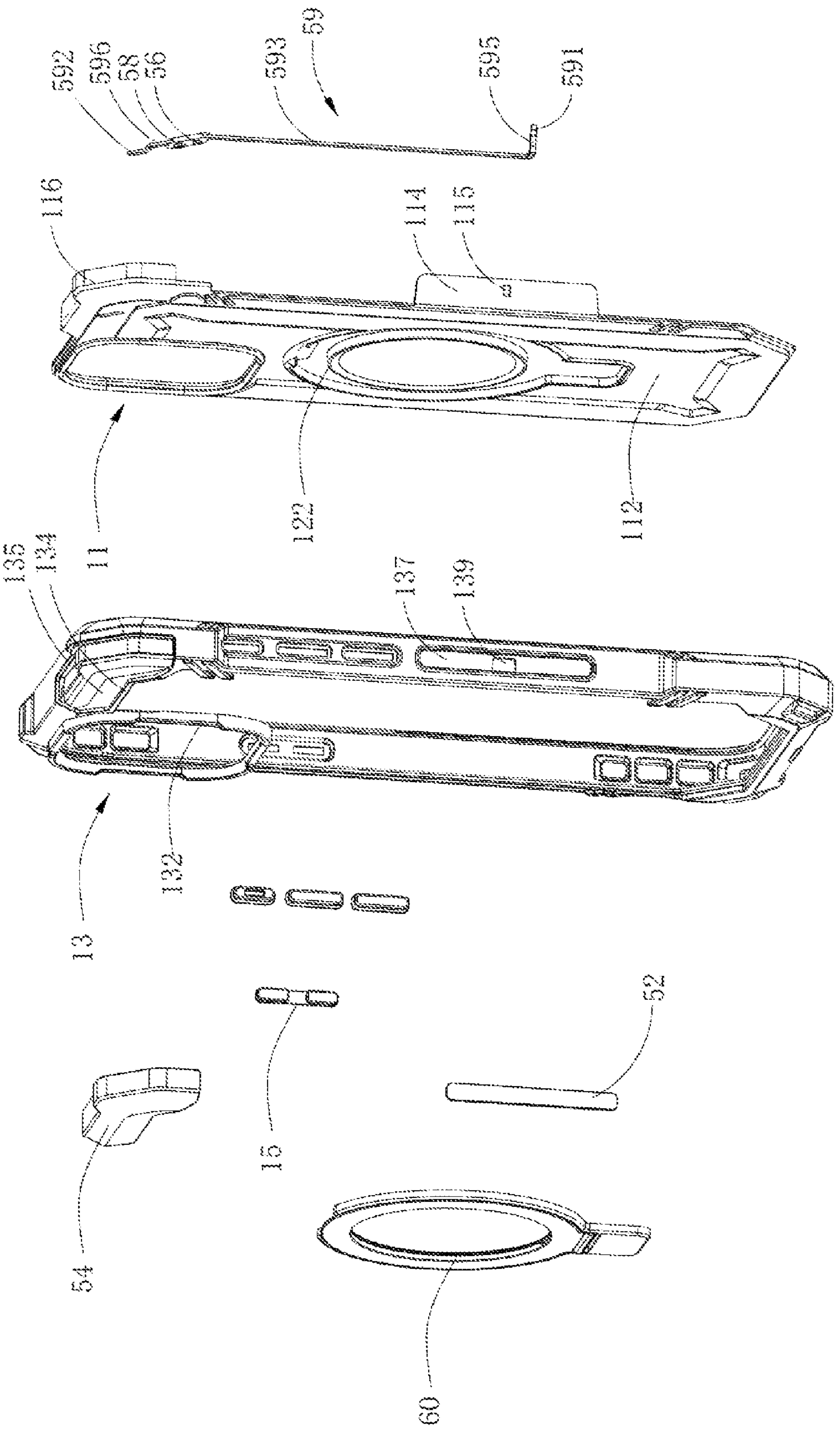
FIG. 3 is an exploded view of the mobile phone protective case with static electricity elimination device shown in FIG. 1.

In order to make the technical problems, solutions, and beneficial effects to be solved in the present application clearer, the following is a further detailed explanation of the present application in conjunction with the accompanying drawings and embodiments. It should be understood that the specific embodiments described here are only used to explain the present application and are not intended to limit it.

It should be noted that when a component is referred to as "fixed to" or "set to" other component, it can be directly or indirectly on the other component. When a component is referred to as "connected to" other component, it can be directly or indirectly connected to the other component.

It should be understood that the terms "length", "width", "up", "down", "front", "back", "left", "right", "vertical", "horizontal", "top", "bottom", "inside", "outside", and other indications of orientation or positional relationships are based on the orientation or positional relationships shown in the accompanying drawings, and are only for the convenience of describing the present application and simplifying the description, rather than indicating or implying that a device or component referred to must have a specific orientation, be constructed and operated in a specific orientation, it cannot be understood as a limitation of the present application.

In addition, the description of "first", "second" etc. in the present application is used for descriptive purpose only and is not to be understood as indicating or imply their relative importance or implicitly indicate the number of indicated technical features. Thus, features defined with "first", "second" may explicitly or implicitly include at least one such feature. In the description of the present application, "multiple" means two or more, unless otherwise specified.

Please refer to FIGS. 1 through 6, a mobile phone protective case with static electricity elimination device 100 according to an embodiment of the present disclosure includes a case 10 and a static electricity elimination device 50 installed therein. The case includes a bottom wall 12 and a side wall 14. The bottom wall 12 is in a flat shape. The side wall 14 protrudes from a periphery of the bottom wall 12 towards one side of the bottom wall 12. The side wall 14 and the bottom wall 12 cooperatively enclose an accommodation cavity 16 for accommodating a phone. The static electricity elimination device 50 is installed in the case 10. The static electricity elimination device 50 includes a first conductive element 52, a second conductive element 54 arranged spaced apart from each other, with a resistor 56 and an LED lamp 58 electrically connected between the first and second conductive elements 52, 54. The first and second conductive elements 52, 54 are at least partly exposed outside the case 10. A receiving groove 18 is defined in an inner side of the case 10 that defines the accommodation cavity 16. The resistor 56 and LED lamp 58 are received in the receiving groove 18.

The first conductive element 52 exposed outside the case 10 is configured to contact a user's body, and the second conductive element 54 is configured to contact the person or object to be contacted by the user, such as a door handle or faucet, etc. When the user is electrostatically charged and there exists a potential difference between the user and the person or object to be contacted, a circuit loop between the first and second conductive elements 52, 54 will be formed, and a current will be consumed through the resistor, and the LED lamp 58 will illuminate at the same time to indicate a process of electrostatic consumption. When the LED lamp 58 is no longer illuminating, it indicates that the static electricity is completely consumed. Therefore, the user can determine through the LED lamp 58 whether the static electricity has been eliminated, thus the mobile phone protective case with static electricity elimination device 100 according to the present disclosure can visually display the static electricity elimination process, which is convenient to use.

The side wall 14 of the case 10 may be provided with key operation portions, sound holes and a data cable plug hole, etc. The bottom wall 12 of the case 10 is provided with a camera opening 120 for exposing the mobile phone camera.

Alternatively, the mobile phone protective case with static electricity elimination device 100 has a stand 60. The stand 60 is rotatably connected to an outer side of the bottom wall 12 that faces away from the accommodation cavity 16. The stand 60 is rotatable in open and closed positions, and an opening angle thereof is adjustable depending on the user's needs. Due to the stand 60, it is helpful for the user to free his or her hands when using the mobile phone, which is convenient for the user to use the mobile phone for a long time, such as when watching a TV show. Alternatively, a holding slot 122 is defined in the outer side of the bottom wall 12 of the case 10, and the stand 60 is received in the holding slot 122 of the bottom wall 12 when folded, resulting in a flat and aesthetic overall appearance of the mobile phone protective case 100. Preferably, a shape and size of the holding slot 122 are adapted to the stand 60. Alternatively, the size of the holding slot 122 is larger than that of the stand 60.

Alternatively, the stand 60 is in a ring shape, with magnetic elements provided therein, which are attachable to a magnetic wireless charger. As such, it allows the mobile phone to be attached to the wireless charger, which is conducive to achieving stable charging and improving charging efficiency.

Figure 4:
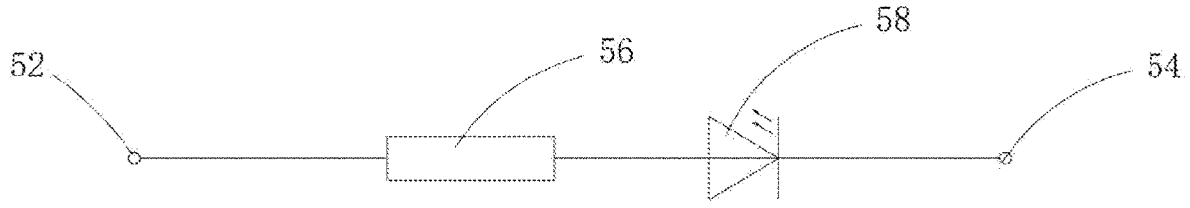
FIG. 4 is a circuitry schematic diagram of the static electricity elimination device of the mobile phone protective case with static electricity elimination device shown in FIG. 1.

Preferably, referring to FIG. 4, the LED lamp 58 and the resistor 56 are connected in series between the first and second conductive elements 52, 54. Since the LED lamp 58 is connected in series with the resistor 56, the current flowing through the LED lamp 58 is equal to that flowing through the resistor 56, and the brightness of the LED lamp 58 varies as the current flowing through the LED lamp 58 varies. Thus, the user can visually assess magnitude of the static electricity through brightness of the LED lamp 58.

In this embodiment, the static electricity elimination device 50 further includes a flexible circuit board 59. The resistor 56 and the LED lamp 58 are fixedly arranged on the flexible circuit board 59. The flexible circuit board 59 includes a first conductive contact portion 591 for electrical connection with the first conductive element 52, and a second conductive contact portion 592 for electrical connection with the second conductive element 54. The first conductive element contact portion 591, the second conductive contact portion 592, the resistor 56 and the LED lamp 58 are electrically connected through conductive lines of the flexible circuit board 59.

The resistor 56 and the LED lamp 58 are directly electrically connected to the flexible circuit board 59. By means of the conductive lines of the flexible circuit board 59, the first and second conductive contact portions 591, 592 are connected to the first and second conductive elements 52, 54, thereby realizing mechanical and electrical connection of the static electricity elimination device. Mounting the resistor 56 and the LED lamp 58 directly on the flexible circuit board 59 facilitates the pre-assembly and modularization of these components 56, 57 and 59. Moreover, the flexible circuit board 59 has good bendability and fits well with structure of the case 10. When assembling the electrostatic electricity elimination device 50 to the case 10, it is easy to assemble and is highly reliable.

Specifically, the flexible circuit board 59 is substantially Z-shaped, including an elongated body portion 593, as well as first and second connecting portions 595, 596 respectively connected to two longitudinal ends of the body portion 593. The first and second connecting portions 595, 596 respectively extend towards opposite sides of the body portion 593, and the first and second conductive contact portions 591, 592 are respectively disposed on the first and second connecting portions 595, 596.

Figure 5:
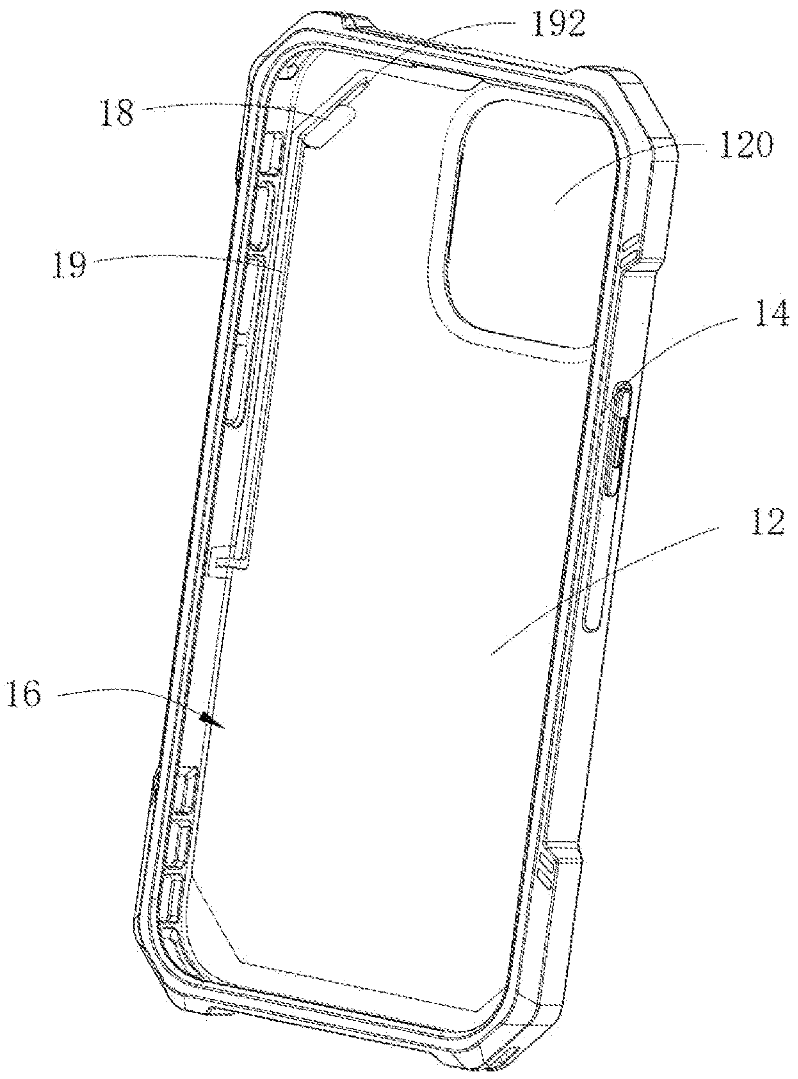
FIG. 5 is a schematic view of the mobile phone protective case with static electricity elimination device shown in FIG. 1, with a circuit board removed.
Figure 6:
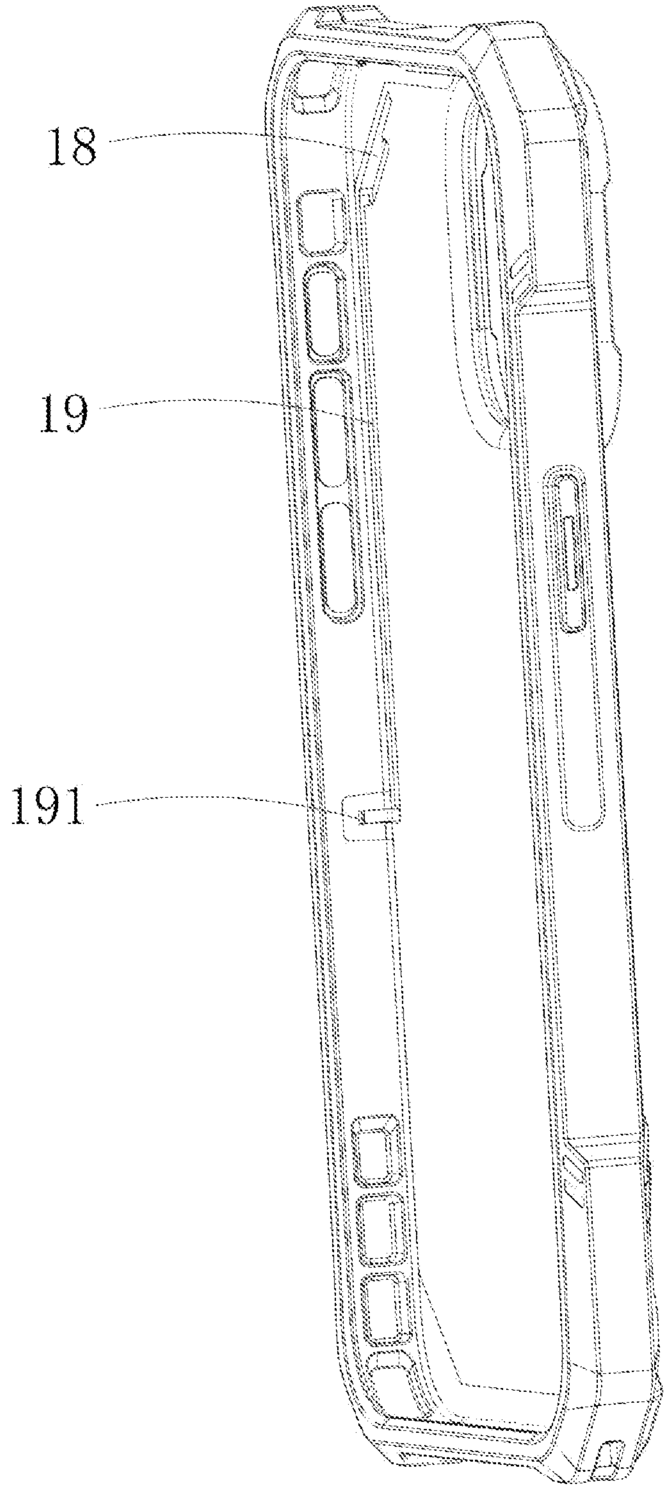
FIG. 6 is a schematic view of FIG. 5, viewed from another angle.

Referring to FIGS. 5 and 6, preferably, an accommodation groove 19 is defined in the inner side of the case 10, and the flexible circuit board 59 is received in the accommodation groove 19. A shape and size of the accommodation groove 19 are generally adapted to the flexible circuit board 59. The accommodation groove 19 is partly arranged on an inner side of the bottom wall 12 that faces the accommodation cavity 16.

Preferably, the flexible circuit board 59 includes opposing first and second surfaces. The first surface faces a bottom of the accommodation groove 19, and the second surface faces the accommodation cavity 16. The conductive lines of the flexible circuit board 59, the resistor 56 and the LED lamp 58 are arranged on the first surface of the flexible circuit board 59, i.e., the side of the flexible circuit board 59 facing away from the accommodation cavity 16. In this way, it is beneficial to protect the circuitry of the static electricity elimination device 50, the resistor 56 and the LED lamp 58.

Figure 7:
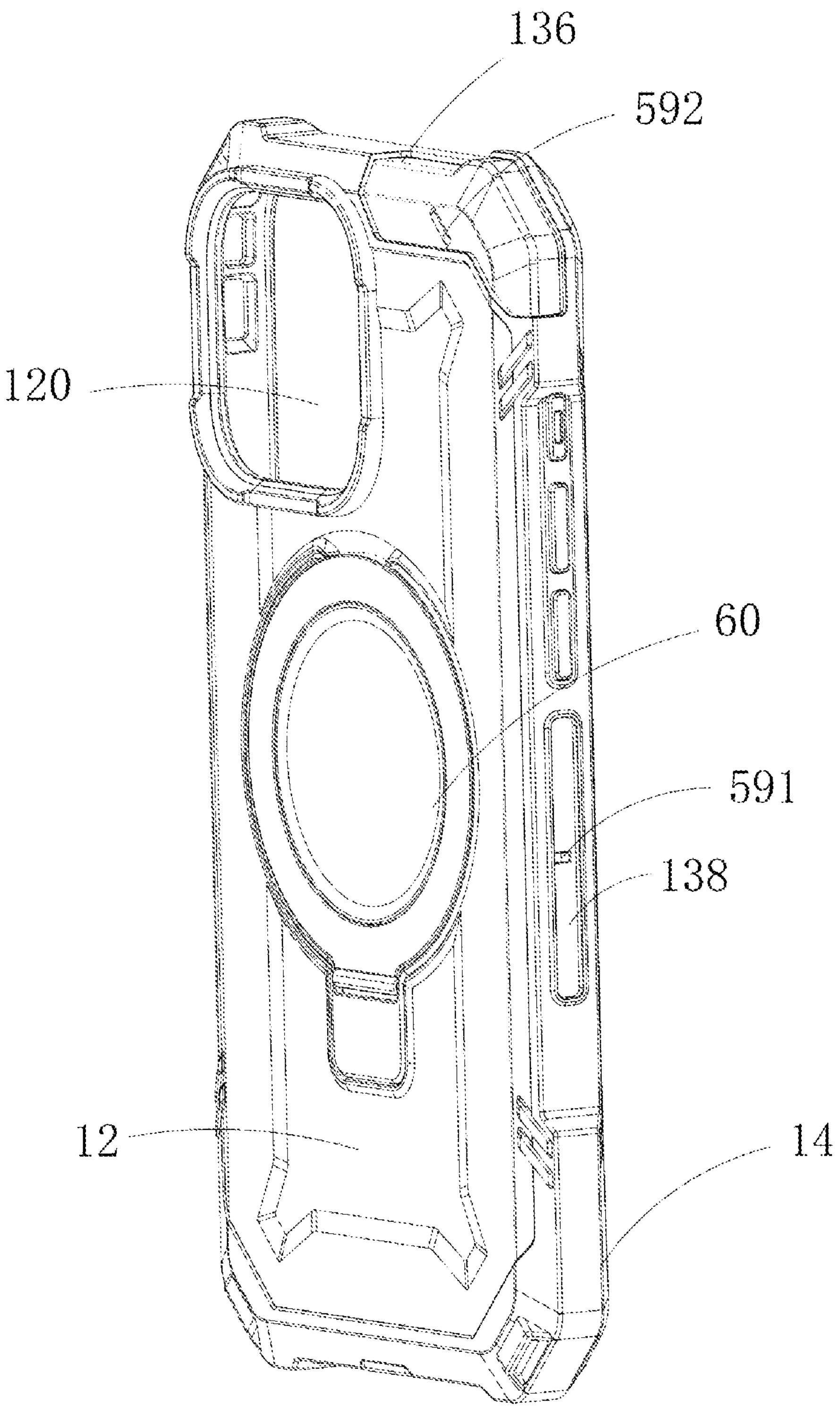
FIG. 7 is a schematic view of the mobile phone protective case with static electricity elimination device shown in FIG. 2, with conductive elements removed.
Figure 8:
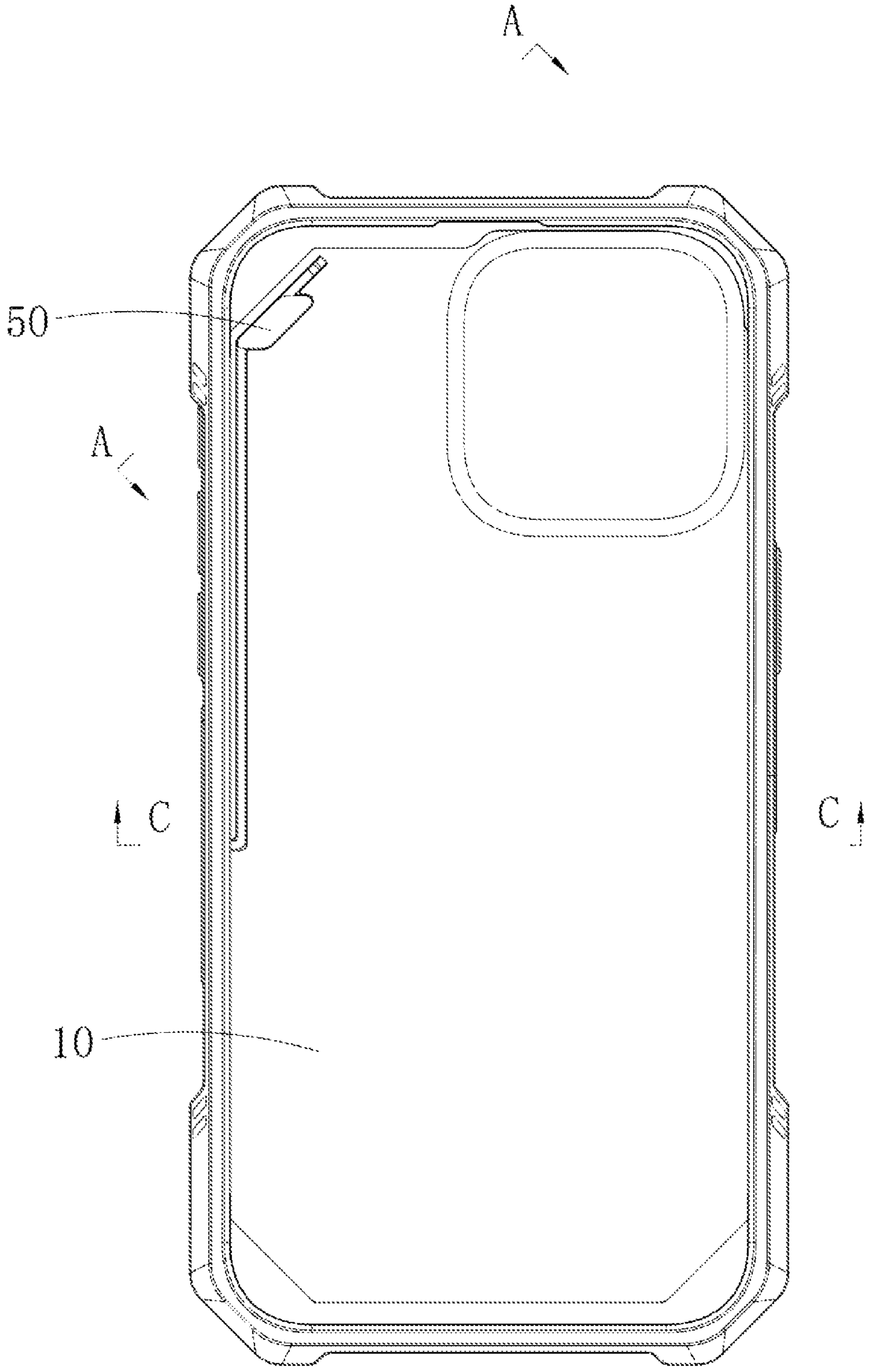
FIG. 8 is a front view of the mobile phone protective case with static electricity elimination device shown in FIG. 1.
Figure 9:
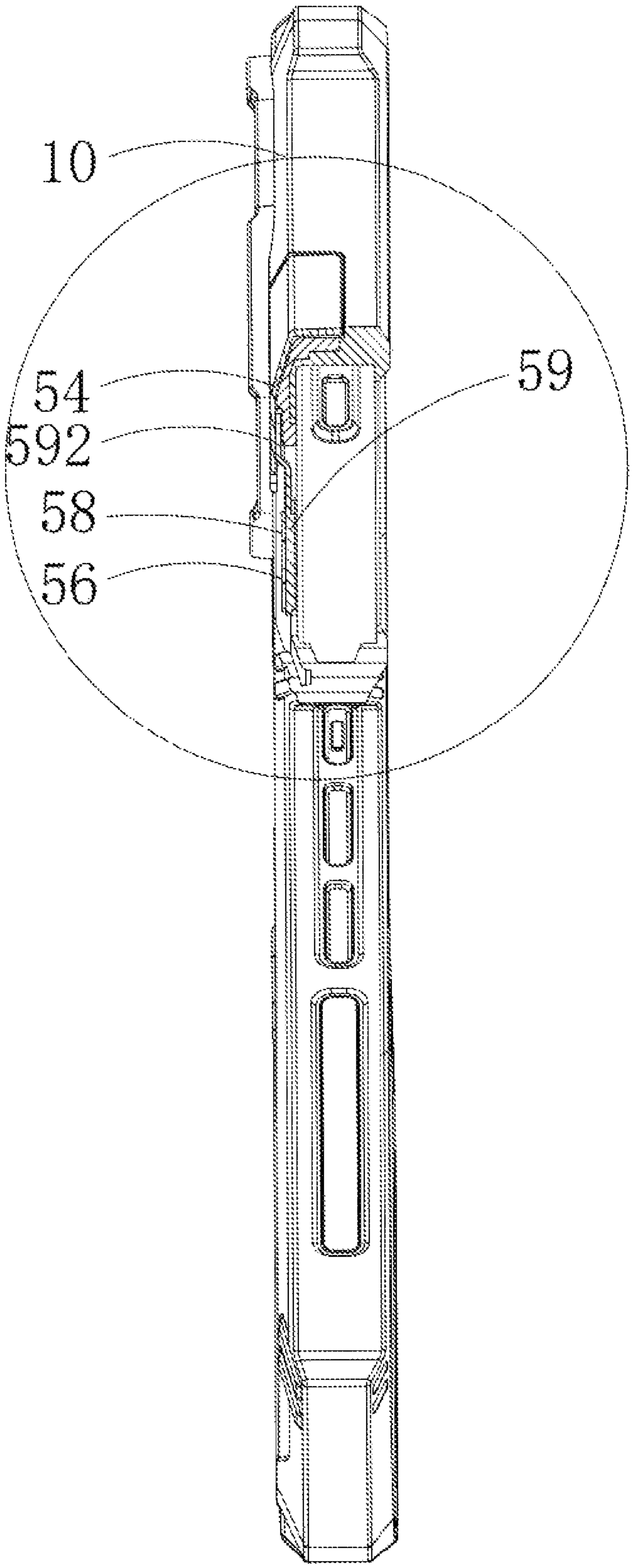
FIG. 9 is a schematic cross-sectional view along line A-A in FIG. 8.
Figure 10:
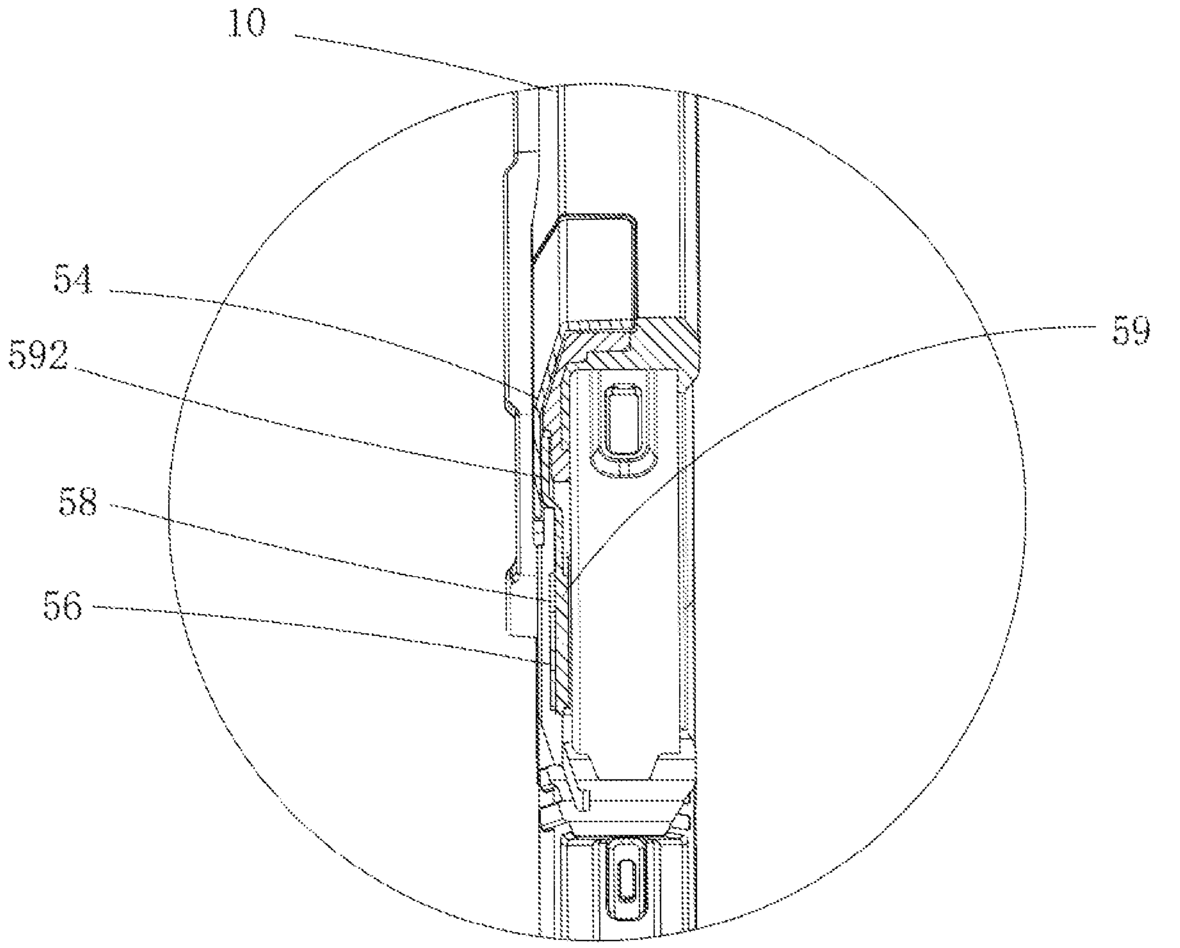
FIG. 10 is an enlarged view of the circled portion in FIG. 9.
Figure 11:
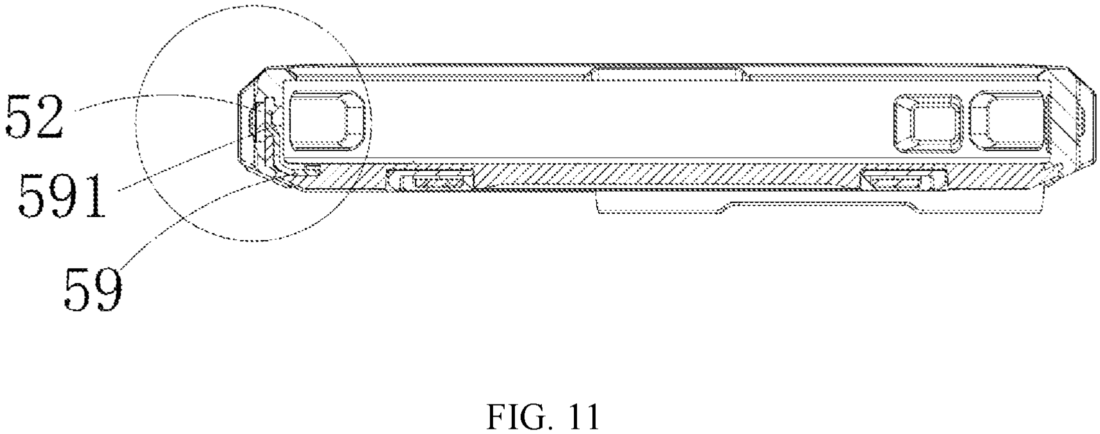
FIG. 11 is a schematic cross-sectional view along line C-C in FIG. 8.
Figure 12:
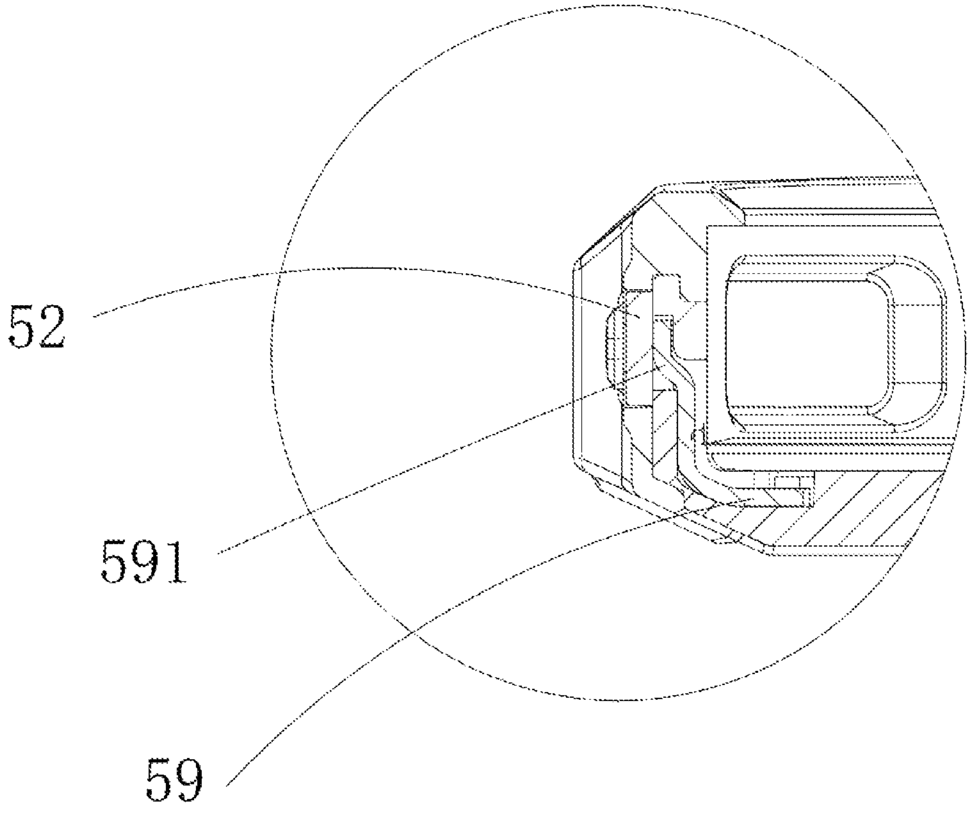
FIG. 12 is an enlarged view of the circled portion in FIG. [10] 11.

Referring to FIGS. 5 through 7, the case 10 is provided with first and second perforations 191, 192 that penetrate inner and outer sides thereof respectively at positions corresponding to the first and second connecting portions 595, 596. The first and second connecting portions 595, 596 of the flexible circuit board 59 extend through the first and second perforations 191, 192, respectively, from the inner side of the case 10 to the outer side of the case 10.

Specifically, the first perforation 191 is defined in the side wall 14 of the case 10, and the second perforation 191 is defined in the bottom wall 12 of the case 10.

The first and second conductive elements 52, 54 are both metal pieces. The first and second conductive elements 52, 54 are snap-connected to the outer side of the case 10 and are electrically connected to the first and second conductive contact portions 591, 592, respectively.

Preferably, the case 10 is substantially rectangular, and the first conductive element 52 is disposed on an outer side of one long side of the case 10 at a middle portion.

The second conductive element 54 is disposed outside a corner of the case 10. Preferably, the first conductive element 52 is disposed outside the corner that is adjacent to the long side of the case 10.

The case 10 includes a back shell 11 forming the bottom wall 12 and a frame 13 forming the side wall 14. The back shell 11 is integrally wrapped around by the frame 13 by overmoulding. The accommodation groove 19 is formed on an inner side of the back shell 11. The accommodation groove 19 extends across the receiving groove 18. Projection of the frame on a plane of the back shell 11 is spaced apart from the LED lamp 5.

The material of the back shell 11 may be different from that of the frame 13. Preferably, the back shell 11 is made of plastic with higher hardness, to provide reliable structural strength for the entire mobile phone protective case 100 as well as good protection for back of the mobile phone. The frame 13 may be made of plastic or rubber with lower hardness and greater elasticity, which is easy to deform when assembling or disassembling the mobile phone. Therefore, it is not only easy to operate but also conducive to better wrapping around the mobile phone after assembly, thereby providing reliable protection in case of collision or falling of the phone.

The back shell 11 includes a plate-shaped main body 112, and first and second protruding portions 114, 116 extending from the main body 112. The main body 112 is substantially rectangular. The first and second protruding portions 114, 116 respectively protrude substantially vertically from an edge of the main body 112. Preferably, the first protruding portion 114 is located at a long edge of the main body 112 and extends vertically relative to a plane of the main body 112. The first protruding portion 114 extends along the long side of the main body 112 in an elongated shape. A first through hole 115 is formed in a central portion of the first protruding portion 114. The second protruding portion 116 is located at a corner of the main body 112 and protrudes from an edge of the corner of the main body 112. The second protruding portion 116 extends along a corner edge of the main body 112 in a bent shape.

Preferably, an inner surface of the main body 112 serves as the inner surface of the bottom wall 12 of the case 10. An outer surface of the main body 112 serves as the outer surface of the bottom wall 12 of the case 10. The inner surface of the main body 112 defines the above-mentioned receiving groove 18 for accommodating the resistor 56 and the LED lamp 58, the accommodation groove 19 for accommodating the flexible circuit board 59, and the second perforation 192 for the second connecting portion 596 of the flexible circuit board 59 to extend through. The holding slot 122 for holding the stand 60 is defined in a central portion of the outer surface of the main body 112. The camera opening 120 is further formed on the main body 112 adjacent to one corner thereof.

The frame 13 is substantially in the shape of a hollow rectangular ring, with an opening formed in a central portion thereof. A shape of the frame 13 approximately matches that of the main body 112. The frame 13 extends along a circumferential direction into a closed shape and wraps around a periphery of the back shell 11. A width of the frame 13 in a direction perpendicular to the main body 112 of the back shell 11 is greater than thickness of the main body 112, so that a portion of the frame extending beyond the main body 112 forms the side wall 14 of the case 10. Openings are respectively formed at a long side of the frame 13 corresponding to multiple keys of the mobile phone, and silicone pieces 15 are received in the openings to form the key operation portions of the mobile phone protective case 100.

Preferably, a recess 137 is formed on an outer side of a wall of the frame 13 corresponding to the first protruding portion 114 of the back shell 11, the shape of the first protruding portion 114 is adapted to the shape of the recess 137, and the first protruding portion 114 is located at a bottom of the recess 137. The wall of the frame 13 and the first protruding portion 114 together define the first groove 138 at the recess 137. The first conductive element 52 is engaged in the first groove 138. A second through hole 139 is formed at a bottom of the first groove 138 for the flexible circuit board 59 to extend through. The second through hole 139 is aligned with the first through hole 115 of the back shell 11 and together form the first perforation 191 for the first connecting portion 595 of the flexible circuit board 59 to extend through.

The frame 13 is formed with a ring 132 corresponds to the camera opening of the back shell 11. The ring 132 is located on an outer surface of the back shell 11 and directly opposite to the opening in the central portion of the frame. A shape and size of the ring 132 are substantially corresponding to those of the camera opening 15 of the back shell 11, and an opening of the ring 132 is aligned with the camera opening 15. A corner wall of the frame 13 corresponding to the second protruding portion 116 of the back shell 11 is located inside the second protruding portion 116, that is, the second protruding portion 116 is located outside the corner wall. The frame 13 is further formed with a limit rib 134 as one single piece, and the limit rib 134 is spaced apart from the corner wall to form a window 135. The limit rib 134 is located outside the second protruding portion 116 of the back shell 11, and the second protruding portion 116 of the back shell 11 is exposed from the window 135. Preferably, a part of the wall of the frame 13 located on both sides of the second protruding portion 116 in a circumferential direction extends beyond an edge of the second protruding portion 116, and this part of the wall and the limit rib 134 cooperatively enclose a second groove 136, and the second conductive element 54 is engaged in the second groove 136.

Referring to FIGS. 8 through 12, the first connecting portion 595 of the flexible circuit board 59 passes through the first perforation 191 and then extends into the first groove 138. The first conductive contact portion 591 contacts the first conductive element 52, achieving electrical connection therebetween. The second connecting portion 596 of the flexible circuit board 59 passes through the second perforation 192 and extends into the second groove 136. The second conductive contact portion 592 contacts the second conductive element 54 engaged in the second groove 136, achieving electrical connection therebetween.

Preferably, the frame 13 and the back shell 11 are formed as one single piece by insertion molding. The back shell 11 is preferably made of a transparent material or semi-transparent material. When the LED lamp 58 illuminates, light emitted from the LED lamp passes through the back shell 11 and is thus visible from outside.

Figure 13:
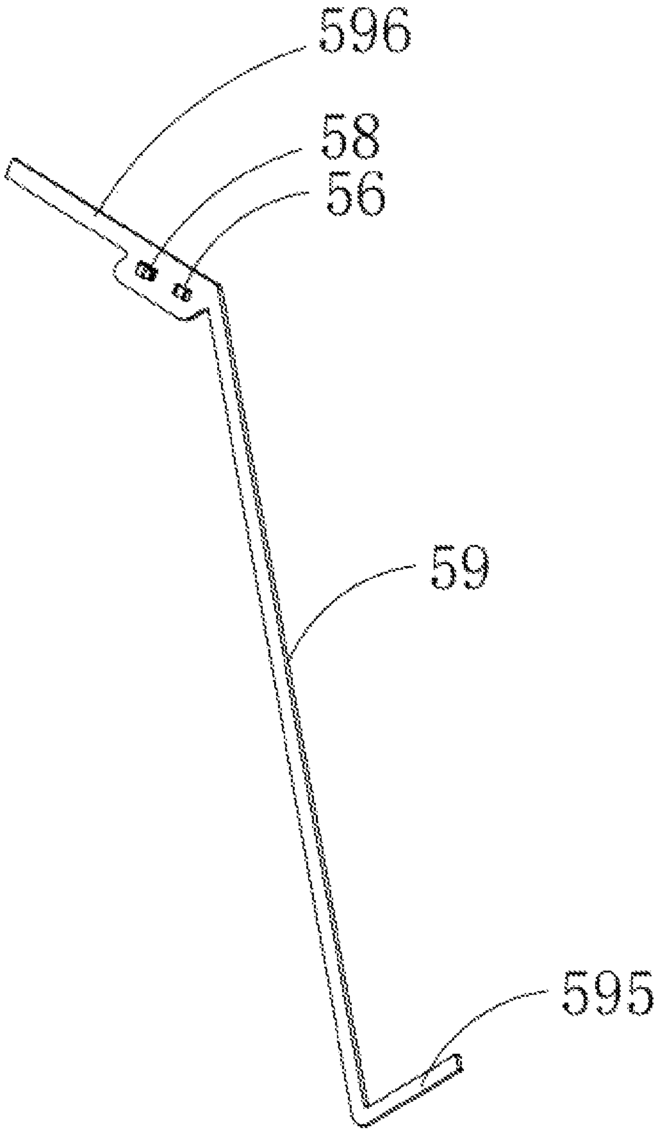
FIG. 13 is a schematic view of a circuit board of a static electricity elimination device of a mobile phone protective case with static electricity elimination device according to another embodiment of the present disclosure.
Figure 14:
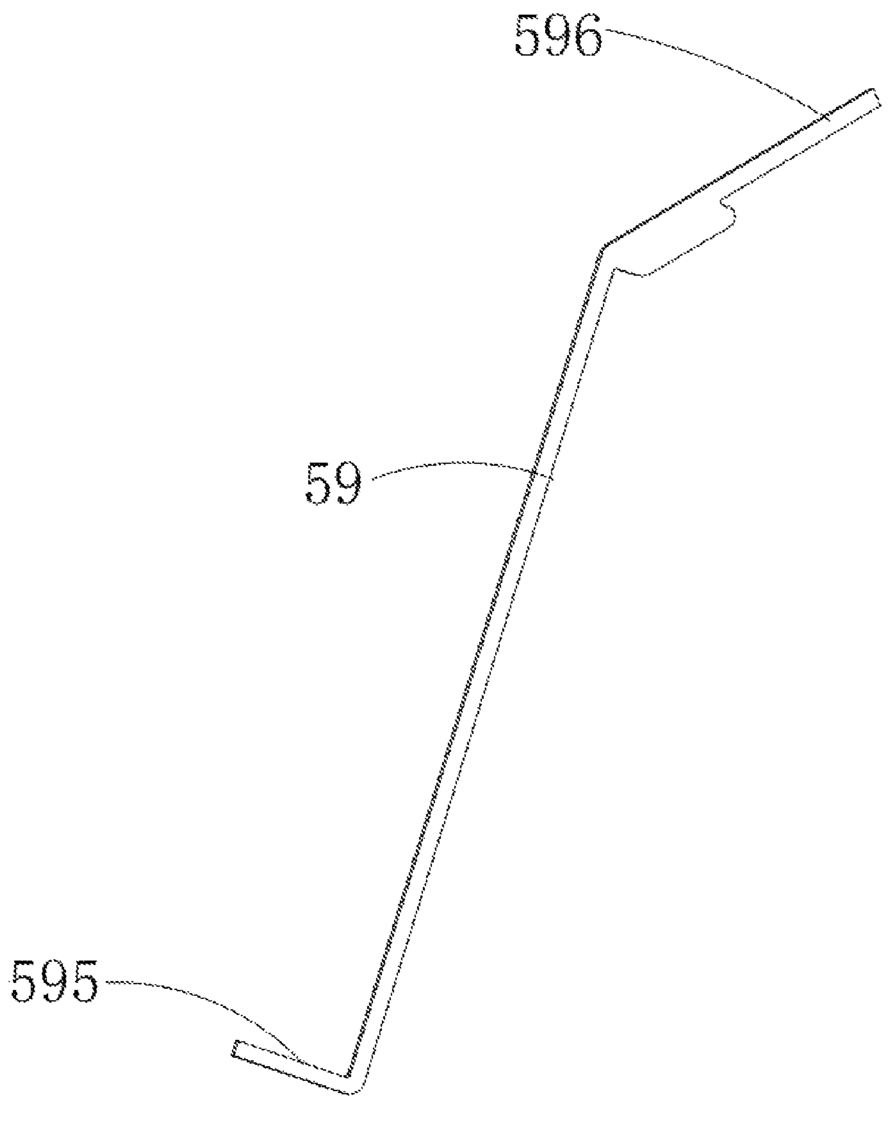
FIG. 14 is a schematic view of the circuit board shown in FIG. 11, viewed from another angle.

Referring to FIGS. 13 and 14, shown are schematic views of the flexible circuit board 59 of the static electricity elimination device of the mobile phone protective case with static electricity elimination device according to an embodiment of the present disclosure before assembly. As shown in the figures, the first and second connecting portions 595, 596 are both in straight strip shape and without bent before assembled. During the assembly, however, the first and second connection portions 595, 596 of the flexible circuit board 59 may be bent by taking advantage of the flexibility of the flexible circuit board, to connect to the first and second conductive elements 52, 54 after passing through the first and second perforations 191,192, respectively. It can be understood that since the flexible circuit board is flexible, it may be adaptively bent according to the shape and structure of the case when assembled. Therefore, its shape can be flexibly set and is not limited to the examples in the embodiments of this disclosure.

The above is only preferred embodiments of the present application, and is not intended to limit the present application. Any simple change, equivalent replacement or improvement of the technical solution within the technical scope disclosed by the application falls within the protection scope of the application.

The invention claimed is:

1. A mobile phone protective case with static electricity elimination device, comprising:

a case comprising a bottom wall and a side wall, the side wall protruding from a periphery of the bottom wall towards one side of the bottom wall, and the side wall and the bottom wall cooperatively enclosing an accommodation cavity for accommodating a mobile phone;

a static electricity elimination device installed in the case, and the static electricity elimination device comprising: a first conductive element and a second conductive element arranged spaced apart from each other, as well as a resistor and an LED lamp electrically connected between the first and second conductive elements, wherein the first and second conductive elements are at least partially exposed outside the case, a receiving groove is defined in an inner side of the case, and the resistor and the LED lamp are received in the receiving groove;

wherein the LED lamp and the resistor are connected in series between the first and second conductive elements;

wherein the static electricity elimination device further comprises a flexible circuit board, the resistor and the LED lamp are arranged on the flexible circuit board, and the flexible circuit board comprises a first conductive contact portion for electrically connecting to the first conductive element as well as a second conductive contact portion for electrically connecting to the second conductive element;

wherein the flexible circuit board is substantially Z-shaped and comprises an elongated body portion, as well as first and second connecting portions respectively connected to two longitudinal ends of the body portion, the first and second connecting portions respectively extend towards two sides of the body portion, and the first and second conductive contact portions are respectively arranged on the first and second connecting portions;

wherein the case is provided with first and second perforations penetrating inner and outer sides thereof at positions corresponding to the first and second connecting portions, respectively, and the first and second connecting portions extend through the first and second perforations, respectively, from the inner side of the case to the outer side of the case;

wherein the case comprises a back shell forming the bottom wall and a frame forming the side wall, the back shell is integrally overmolded with the frame, an accommodation groove is formed on an inner side of the back shell, the accommodation groove extends across the receiving groove, and projection of the frame on a plane of the back shell is spaced apart from the LED lamp; and wherein the back shell comprises a plate-shaped main body and a first protruding portion extending from the main body, the first protruding portion is located at a long edge of the main body, a recess is formed on an outer side of a wall of the frame corresponding to the first protruding portion of the back shell, the wall of the frame and the first protruding portion together define a first groove at the recess, and the first conductive element is engaged in the first groove.

2. The mobile phone protective case with static electricity elimination device according to claim 1, wherein the accommodation groove is defined in the inner side of the case, and the flexible circuit board is received in the accommodation groove.

3. The mobile phone protective case with static electricity elimination device according to claim 2, wherein conductive lines of the flexible circuit board, the resistor and the LED lamp are arranged on a surface of the flexible circuit board facing a bottom of the accommodation groove.

4. The mobile phone protective case with static electricity elimination device according to claim 1, wherein the first and second conductive elements are both metal pieces, and the first and second conductive elements are snap-connected to the outer side of the case and are electrically connected to the first and second conductive contact portions, respectively.

5. The mobile phone protective case with static electricity elimination device according to claim 1, wherein the back shell is made of transparent materials or semi-transparent materials, and when the LED lamp is lit, light emitted from the LED lamp passes through the back shell and is thus visible from outside.

6. The mobile phone protective case with static electricity elimination device according to claim 1, wherein the case is substantially rectangular, and the first conductive element is disposed on an outer side of one long side of the case at a middle portion.

7. The mobile phone protective case with static electricity elimination device according to claim 6, wherein the second conductive element is disposed outside a corner of the case.

8. The mobile phone protective case with static electricity elimination device according to claim 6, wherein the second conductive element is disposed outside the corner that is adjacent to the long side of the case.

9. The mobile phone protective case with static electricity elimination device according to claim 1, wherein the first perforation is defined in the side wall of the case, and the second perforation is defined in the bottom wall of the case.

10. The mobile phone protective case with static electricity elimination device according to claim 1, wherein the back shell is made of plastic with higher hardness, and the frame is made of plastic or rubber with lower hardness and greater elasticity.

11. The mobile phone protective case with static electricity elimination device according to claim 1, wherein a first through hole is formed in a central portion of the first protruding portion, a second through hole is formed at a bottom of the first groove for the flexible circuit board to extend through, and the second through hole is aligned with the first through hole of the back shell and together form the first perforation for the first connecting portion of the flexible circuit board to extend through.

12. The mobile phone protective case with static electricity elimination device according to claim 1, wherein an inner surface of the main body defines the receiving groove for accommodating the resistor and the LED lamp, the accommodation groove for accommodating the flexible circuit board, and the second perforation for the second connecting portion of the flexible circuit board to extend through.

13. The mobile phone protective case with static electricity elimination device according to claim 1, wherein the back shell further comprises a second protruding portion extending from a corner of the main body, the frame is formed with a limit rib as one single piece, the limit rib is spaced apart from a corner wall to form a window, the limit rib is located outside the second protruding portion of the back shell, and the second protruding portion of the back shell is exposed from the window; wherein a part of the wall of the frame located on both sides of the second protruding portion in circumferential direction extends beyond an edge of the second protruding portion, the part of the wall and the limit rib cooperatively enclose a second groove, and the second conductive element is engaged in the second groove.

14. The mobile phone protective case with static electricity elimination device according to claim 1, wherein a width of the frame in a direction perpendicular to the main body of the back shell is greater than thickness of the main body, so that a part of the frame beyond the main body forms the side wall of the case.

15. A mobile phone protective case with static electricity elimination device, comprising:

a case comprising a bottom wall and a side wall, the side wall protruding from a periphery of the bottom wall, and the side wall and the bottom wall cooperatively enclosing an accommodation cavity for accommodating a mobile phone;

a static electricity elimination device installed in the case, and the static electricity elimination device comprising: a first conductive element and a second conductive element arranged spaced apart from each other, as well as a resistor and an LED lamp electrically connected between the first and second conductive elements, wherein the first and second conductive elements are at least partially exposed outside the case, a receiving groove is defined in an inner side of the case, and the resistor and the LED lamp are received in the receiving groove;

wherein the case comprises a back shell forming the bottom wall and a frame forming the side wall, the back shell is integrally overmolded with the frame; and wherein the back shell comprises a plate-shaped main body and a first protruding portion extending from the main body, the first protruding portion is located at a long edge of the main body, a recess is formed on an outer side of a wall of the frame corresponding to the first protruding portion of the back shell, the wall of the frame and the first protruding portion together define a first groove at the recess, and the first conductive element is engaged in the first groove.

16. The mobile phone protective case with static electricity elimination device according to claim 15, wherein the static electricity elimination device further comprises a flexible circuit board, the resistor and the LED lamp are arranged on the flexible circuit board, and the flexible circuit board comprises a first conductive contact portion for electrically connecting to the first conductive element as well as a second conductive contact portion for electrically connecting to the second conductive element.

17. The mobile phone protective case with static electricity elimination device according to claim 16, wherein the flexible circuit board is substantially Z-shaped and comprises an elongated body portion, as well as first and second connecting portions respectively connected to two longitudinal ends of the body portion, the first and second connecting portions respectively extend towards two sides of the body portion, and the first and second conductive contact portions are respectively arranged on the first and second connecting portions.

18. The mobile phone protective case with static electricity elimination device according to claim 17, wherein the case is provided with first and second perforations penetrating inner and outer sides thereof at positions corresponding to the first and second connecting portions, respectively, and the first and second connecting portions extend through the first and second perforations, respectively, from the inner side of the case to the outer side of the case.

19. The mobile phone protective case with static electricity elimination device according to claim 15, wherein the back shell further comprises a second protruding portion extending from a corner of the main body, the frame is formed with a limit rib as one single piece, the limit rib is spaced apart from a corner wall to form a window, the limit rib is located outside the second protruding portion of the back shell, and the second protruding portion of the back shell is exposed from the window; wherein a part of the wall of the frame located on both sides of the second protruding portion in circumferential direction extends beyond an edge of the second protruding portion, the part of the wall and the limit rib cooperatively enclose a second groove, and the second conductive element is engaged in the second groove.

20. A mobile phone protective case with static electricity elimination device, comprising:

a case comprising a bottom wall and a side wall, the side wall protruding from a periphery of the bottom wall, and the side wall and the bottom wall cooperatively enclosing an accommodation cavity for accommodating a mobile phone;

a static electricity elimination device installed in the case, and the static electricity elimination device comprising: a first conductive element and a second conductive element arranged spaced apart from each other, as well as a resistor and an LED lamp electrically connected between the first and second conductive elements, wherein the first and second conductive elements are at least partially exposed outside the case, a receiving groove is defined in an inner side of the case, and the resistor and the LED lamp are received in the receiving groove;

wherein the static electricity elimination device further comprises a flexible circuit board, the resistor and the LED lamp are arranged on the flexible circuit board, and the flexible circuit board comprises a first conductive contact portion for electrically connecting to the first conductive element as well as a second conductive contact portion for electrically connecting to the second conductive element;

wherein the flexible circuit board is a unitary circuit board and, before assembly, has a substantially Z-shaped physical profile, the flexible circuit board comprising an elongated body portion and first and second connecting portions respectively connected to two longitudinal ends of the body portion, wherein the first and second connecting portions respectively extend towards two sides of the body portion, the first and second conductive contact portions are respectively arranged on the first and second connecting portions; and wherein the case is provided with first and second perforations penetrating inner and outer sides thereof at positions corresponding to the first and second connecting portions, respectively, and the first and second connecting portions extend through the first and second perforations, respectively, from the inner side of the case to the outer side of the case.

* * * * *